(12) United States Patent
Huang et al.

(10) Patent No.: US 10,765,010 B2
(45) Date of Patent: *Sep. 1, 2020

(54) ELECTROLYTIC COPPER FOIL FOR PRINTED CIRCUIT BOARD WITH LOW TRANSMISSION LOSS

(71) Applicant: Chang Chun Petrochemical Co., Ltd, Taipei (TW)

(72) Inventors: Jian-Ming Huang, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/694,434

(22) Filed: Nov. 25, 2019

(65) Prior Publication Data

US 2020/0253061 A1    Aug. 6, 2020

Related U.S. Application Data

(60) Provisional application No. 62/800,263, filed on Feb. 1, 2019.

(51) Int. Cl.
  *B21C 37/00* (2006.01)
  *H05K 3/38* (2006.01)
  *B32B 15/08* (2006.01)

(52) U.S. Cl.
  CPC ............. *H05K 3/389* (2013.01); *B32B 15/08* (2013.01); *H05K 2201/0355* (2013.01); *H05K 2203/0307* (2013.01); *Y10T 428/12431* (2015.01)

(58) Field of Classification Search
  None
  See application file for complete search history.

(56) References Cited

U.S. PATENT DOCUMENTS

| | | | |
|---|---|---|---|
| 9,899,683 | B2 | 2/2018 | Lee et al. |
| 10,205,170 | B1 | 2/2019 | Huang et al. |
| 10,424,793 | B2 | 9/2019 | Cheng et al. |
| 2004/0029006 | A1 | 2/2004 | Otsuka et al. |
| 2006/0210823 | A1 | 9/2006 | Sano et al. |

(Continued)

FOREIGN PATENT DOCUMENTS

| CN | 2752274 Y | 1/2006 |
|---|---|---|
| CN | 1995469 A | 7/2007 |

(Continued)

OTHER PUBLICATIONS

Office Action for TW109101362 dated Mar. 18, 2020.

(Continued)

*Primary Examiner* — Seth Dumbris
(74) *Attorney, Agent, or Firm* — Nixon Peabody LLP; Thomas P. Pavelko

(57) ABSTRACT

Surface-treated copper foils that exhibit a material volume (Vm) in a range of 0.05 to 0.6 $\mu m^3/\mu m^2$ and a yellowness index (YI) in a range of 17 to 52 are reported. Where the surface-treated copper foil is treated on the deposited side and includes a treatment layer comprising a nodule layer. Such surface-treated copper foils can be used as a conductive material having low transmission loss, for example in circuit boards.

15 Claims, 3 Drawing Sheets

(56) References Cited

U.S. PATENT DOCUMENTS

| | | | | |
|---|---|---|---|---|
| 2008/0280159 A1* | 11/2008 | Iwakiri | ............... | C25D 7/06 |
| | | | | 428/687 |
| 2011/0127074 A1* | 6/2011 | Takahashi | ............ | C25D 3/38 |
| | | | | 174/257 |
| 2012/0111733 A1 | 5/2012 | Tsai et al. | | |
| 2013/0011690 A1* | 1/2013 | Arai | ............... | C25D 5/16 |
| | | | | 428/548 |
| 2013/0040162 A1 | 2/2013 | Fujisawa et al. | | |
| 2014/0264417 A1 | 9/2014 | Kobayashi et al. | | |
| 2016/0264417 A1 | 9/2016 | Bouillon et al. | | |
| 2017/0320247 A1 | 11/2017 | Aizawa et al. | | |
| 2018/0245230 A1 | 8/2018 | Sonoda et al. | | |
| 2018/0279482 A1 | 9/2018 | Ishii et al. | | |
| 2018/0282890 A1 | 10/2018 | Chun et al. | | |
| 2019/0245014 A1 | 8/2019 | Park et al. | | |
| 2019/0249322 A1 | 8/2019 | Lee et al. | | |

FOREIGN PATENT DOCUMENTS

| | | | |
|---|---|---|---|
| CN | 101098005 | A | 1/2008 |
| CN | 101669237 | A | 3/2010 |
| CN | 102418129 | A | 4/2012 |
| CN | 102965698 | A | 3/2013 |
| CN | 103911633 | A | 7/2014 |
| CN | 104781973 | A | 7/2015 |
| CN | 104812945 | A | 7/2015 |
| CN | 104884409 | A | 9/2015 |
| CN | 104928726 | A | 9/2015 |
| CN | 105814242 | A | 7/2016 |
| CN | 105986288 | A | 10/2016 |
| CN | 106304615 | A | 1/2017 |
| CN | 106455310 | A | 2/2017 |
| CN | 106455341 | A | 2/2017 |
| CN | 106455342 | A | 2/2017 |
| CN | 106953099 | A | 7/2017 |
| CN | 108124392 | A | 6/2018 |
| CN | 108306022 | A | 7/2018 |
| CN | 108345195 | A | 7/2018 |
| CN | 108728874 | A | 11/2018 |
| CN | 110004467 | A | 7/2019 |
| EP | 367442 | A | 9/2016 |
| JP | 2000119892 | A | 4/2000 |
| JP | 2001192879 | A | 7/2001 |
| JP | 2012136736 | A | 7/2012 |
| JP | 2012172198 | A | 9/2012 |
| JP | 2016009526 | A | 1/2016 |
| JP | 2018028147 | A | 2/2018 |
| JP | 2018524772 | A | 8/2018 |
| KR | 10-2015-0062230 | A | 6/2015 |
| KR | 20180080512 | A | 7/2018 |
| TW | 201219606 | A | 5/2012 |
| TW | 417424 | A | 12/2013 |
| TW | 201738413 | A | 1/2017 |
| TW | 201716594 | A | 5/2017 |
| TW | 201726961 | A | 8/2017 |
| TW | 201832922 | A | 9/2018 |
| TW | 201834303 | A | 9/2018 |
| WO | 2018207786 | A1 | 11/2008 |
| WO | 2014065431 | A1 | 5/2014 |
| WO | 2017051767 | A1 | 9/2017 |
| WO | 2018110579 | A1 | 6/2018 |

OTHER PUBLICATIONS

International Search Report for PCT/CN2020/072312 dated Mar. 26, 2020.
International Search Report for PCT/CN2020/072300 dated Mar. 24, 2020.
Non-Final Office Action for U.S. Appl. No. 16/694,412, dated Feb. 10, 2020.
Non-Final Office Action for U.S. Appl. No. 16/715,284, dated Feb. 18, 2020.
Final Office Action for U.S. Appl. No. 16/654,723, dated Apr. 7, 2020.
Gadelmawla et al., "Roughness Parameters", Jan. 14, 2002, Journal of Materials Processing Technology, 123 (Year 2002), pp. 133-145.
Ficker et al., "Surface Roughness and Porosity of Hydrated Cement Pastes", 2011, Acta Polytechnica vol. 51 No. 3 (Year: 2011), pp. 1-14.
Office Action in U.S. Appl. No. 16/429,921, dated Aug. 23, 2019.
Office Action in U.S. Appl. No. 16/654,723, dated Jan. 3, 2020.
Notice of Allowance in U.S. Appl. No. 16/584,157 dated Jan. 15, 2020.
Notice of Allowance in U.S. Appl. No. 16/429,921 dated Dec. 12, 2019.
Huang, Chein-Ho, et al., Pulsed Deposition of Ultra-thin Copper Foils; Plating & Surface Finishing, Sep. 2004, pp. 34-38.
Belov, Valery, et al., Correlation between 3D Texture of Steel Substrate and Tin-Coated Surface with Various Coating Masses; Key Engineering Materials, 2018, pp. 120-127, vol. 769, www.scientific.net/KEM.769.120, Trans Tech Publication, Switzerland.
International Search Report for PCT/CN2020/072158 dated Apr. 8, 2020.
International Search Report for PCT/CN2020/072157 dated Apr. 21, 2020.
TW Notice of Allowance for Application No. 109101364 dated May 25, 2020.
TW Notice of Allowance for Application No. 109101373 dated Jun. 15, 2020.
European Search Report for Application No. 20152064.0 dated Jun. 5, 2020.
International Search Report for Application No. PCT/CN2020/072282 dated Apr. 15, 2020.
International Search Report for Application No. PCT/CN2020/072305 dated Apr. 13, 2020.

\* cited by examiner

ELECTROLYTIC COPPER FOIL FOR PRINTED CIRCUIT BOARD WITH LOW TRANSMISSION LOSS

CROSS REFERENCE TO RELATED APPLICATIONS

This application claims the benefit under 35 U.S.C. § 119(e) of U.S. Provisional Application No. 62/800,263 filed Feb. 1. 2019, the contents of which are incorporated herein by reference in their entirety.

FIELD OF THE INVENTION

The present disclosure relates to electrodeposited copper foils having controlled surface properties. The disclosure also relates to circuit boards and the like which exhibit low transmission loss of electrical signals and which incorporate the electrodeposited copper foils as a component thereof.

BACKGROUND

The increasing demands for transmitting massive data requires ever increasing signal transmission speeds between components on circuit boards. To achieve these speeds, frequency ranges are necessarily increasing from below 1 MHz to, 1 GHz, 10 GHz or even higher. In these higher ranges, the currents flow mostly near the surface of the conductor due to the well-known "skin effect" which is the tendency of high frequency current density to be highest at the surface of a conductor and to decay exponentially towards the center. The skin depth, where approximately 67% of the signal is carried, is inversely proportional to the square root of the frequency. Accordingly, at 1 MHz the skin depth is 65.2 µm, at 1 GHz it is 2.1 µm, while at 10 GHz the skin depth is only 0.7 µm. At the higher frequencies, the surface topography or roughness of the conductor becomes ever more important since a roughness on the order of, or greater than, the skin depth will impact the signal transmission.

Very Low Profile (VLP) copper foil has a very low roughness. This provides very good performance with respect to signal transmission even at high frequencies. However, VLP copper foil has poor adhesion to the resin layer used in the laminated structures of circuit boards. In fact, the balance between surface roughness for good adhesion and low roughness to provide for good signal transmission presents a challenge. A common approach is to intentionally roughen the conductor surface to improve adhesion characteristics. A surface roughness, Rz, on the roughened surface on the order of µm is typical and, while it can enhance adhesion, it will impact transmission in the GHz range. The design for a good copper foil is therefore constrained by the conflicting need for high roughness to ensure enough adhesion, and low roughness to minimize transmission loss.

There therefore remains a need for copper foils with low transmission loss and good adhesion strength for the manufacturing of circuit boards.

SUMMARY

In general, the disclosure herein relates to a copper foil such as electrodeposited copper foils that can be used as a conductor in a circuit board. Copper foils have been prepared having controlled surface properties that provide for low transmission loss even at high frequencies and high adhesion to the resin layer in the circuit board.

In a first aspect, the disclosure provides a surface-treated copper foil comprising an electrodeposited copper foil and a treatment layer. The electrodeposited copper foil includes a drum side and a deposited side. The treatment layer is disposed on the deposited side and provides a surface-treated side, wherein the treatment layer comprises a nodule layer. The surface-treated side exhibits a material volume (Vm) in a range of 0.05 to 0.6 $\mu m^3/\mu m^2$ and a yellowness index (YI) in a range of 17 to 52. Optionally the surface-treated side exhibits a Vm in a range of 0.05 to 0.5 $\mu m^3/\mu m^2$, such as in a range of 0.05 to 0.3 $\mu m^3/\mu m^2$. Optionally, the nodule layer comprises copper nodules.

In some options, the surface-treated side exhibits a void volume (Vv) in a range of 0.10 to 0.85 $\mu m^3/\mu m^2$. Optionally, the surface-treated side exhibits a void volume (Vv) in a range of 0.39 to 0.85 $\mu m^3/\mu m^2$, or optionally the surface-treated side exhibits a void volume (Vv) in a range of 0.50 to 0.85 $\mu m^3/\mu m^2$.

In some options, the surface-treated copper foil exhibits a yield strength in a range of 8.5 $kg/mm^2$ to 26 $kg/mm^2$ based on extension under load method at 0.5% strain. Optionally, the surface-treated copper foil exhibits a yield strength in a range of 8.5 $kg/mm^2$ to 20 $kg/mm^2$ based on extension under load method at 0.5% strain. Optionally, the surface-treated copper foil exhibits a yield strength in a range of 8.5 $kg/mm^2$ to 17 $kg/mm^2$ based on extension under load method at 0.5% strain.

In some other options the treatment layer further comprises at least one of a barrier layer, an anti-tarnish layer, and a coupling layer. Optionally, the barrier layer is made of metal or alloy containing the metal, and the metal is selected from at least one of Ni, Zn, Cr, Co, Mo, Fe, Sn, and V. Optionally, the coupling layer includes silicon.

In a second aspect, the disclosure provides a laminate comprising a resin layer and a surface-treated copper foil according to the first aspect of the disclosure. The surface-treated side of the surface-treated copper foil is in contact with the resin layer, and exhibits a material volume (Vm) in a range of 0.05 to 0.6 $\mu m^3/\mu m^2$, a void volume (Vv) in a range of 0.10 to 0.85 $\mu m^3/\mu m^2$, a yellowness index (YI) in a range of 17 to 52, and a yield strength in a range of 8.5 $kg/mm^2$ to 26 $kg/mm^2$ based on extension under load method at 0.5% strain.

In a third aspect, the disclosure provides a device comprising a circuit board and a plurality of components. The circuit board comprises the surface-treated copper foil according to the first aspect. The plurality of components is mounted on the circuit board. At least a first component and a second component of the plurality of components are electrically connected to each other through the surface-treated copper foil of the circuit board.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
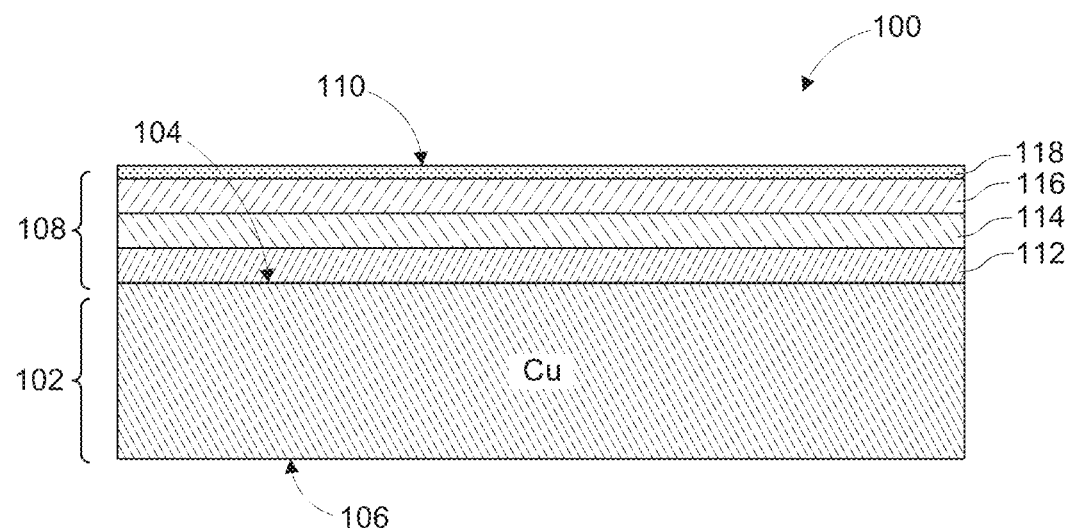
FIG. 1 shows a surface-treated copper foil according to some embodiments.

The present disclosure is susceptible to various modifications and alternative forms. Some representative embodiments have been shown by way of example in the drawings and will be described in detail herein. It should be understood, however, that the inventions are not intended to be limited to the particular forms disclosed. Rather, the disclosure is to cover all modifications, equivalents, and alternatives falling within the spirit and scope of the inventions as defined by the appended claims.

DETAILED DESCRIPTION

Surface-treated copper foils are described that exhibit low transmission loss. The surface-treated copper foils have controlled surface characteristics such as material volumes and yellowness index. Such surface-treated copper foil can be useful for the production of articles needing low transmission loss of electrical signals, such as printed circuit boards or any thin copper foil covering an insulator.

FIG. 1 shows a schematic cross-sectional view of an embodiment of a surface-treated copper foil 100, which includes an electrodeposited copper foil 102 and a treatment layer 108. The electrodeposited copper foil 102 has a deposited side 104 and a drum side 106. The treatment layer 108 is disposed on the deposited side 104 and provides a surface-treated side 110.

As used herein the "drum side" or "shiny side" of the electrodeposited copper foil is the surface of the electrodeposited copper foil that is in contact with a cathode drum used during the electrodeposition, while the "deposited side" is the opposite side to the drum side, or the surface of the electrodeposited copper foil that is in contact with an electrolyte solution during the electrodeposition forming the electrodeposited copper foil. These terms relate to a manufacturing process for producing electrodeposited copper foils which include partially immersing the rotating cathode drum assembly into the electrolyte solution containing copper ions. Therefore, under operation of an electric current, copper ions are drawn to the cathode drum and reduced, resulting in copper metal plating onto the surface of the cathode drum forming an electrodeposited copper foil on the surface of the cathode drum. This electrodeposited copper foil is formed and removed from the cathode drum in a continuous process by rotating the cathode drum and removing the electrodeposited copper foil as the formed copper foil rotates with the cathode drum out of the electrolyte solution. For example, the electrodeposited copper foil can be pulled off the cathode drum as it is formed by, and passed over or through rollers in a continuous process.

The electrodeposited copper foil 102 can be further treated on its deposited side 104 and/or drum side 106 with a surface treatment, forming a treatment layer. As shown in FIG. 1, the deposited side 104 is covered with the treatment layer 108, providing a surface-treated side 110, which is the exterior surface of the treatment layer 108. The surface treatment can include one or more treatments such as a roughening treatment to provide a nodule layer 112, a passivation treatment to provide a barrier layer 114, an anti-tarnishing treatment to provide an anti-tarnish layer 116, and a coupling treatment to provide a coupling layer 118. Therefore, in the embodiment shown in FIG. 1, the nodule layer 112, barrier layer 114, anti-tarnish layer 116, and coupling layer 118 are sub-layers of the treatment layer 108. The surface treatment and specific sub layers of treatment layer 108 shown in the figure are an embodiment, and other surface treatments and other sub layers in addition to or as alternatives thereof can be used in some other embodiments. Accordingly, one or more than one of the sub-layers may be present in the different embodiments of the treatment layer 108.

By controlling the surface properties of the surface-treated side 110, good adhesion can be achieved while maintaining good transmission loss at high frequencies. For example, the surface-treated side 110 can have controlled surface properties as characterized by material volume (Vm) and Yellowness Index (YI). In addition, by controlling the bulk properties of the surface-treated copper foil, good mechanical properties such as reduced curl and wrinkling of the surface-treated copper foil can be achieved. For example, the surface-treated copper foil can have controlled mechanical properties characterized by yield strength.

Figure 2:
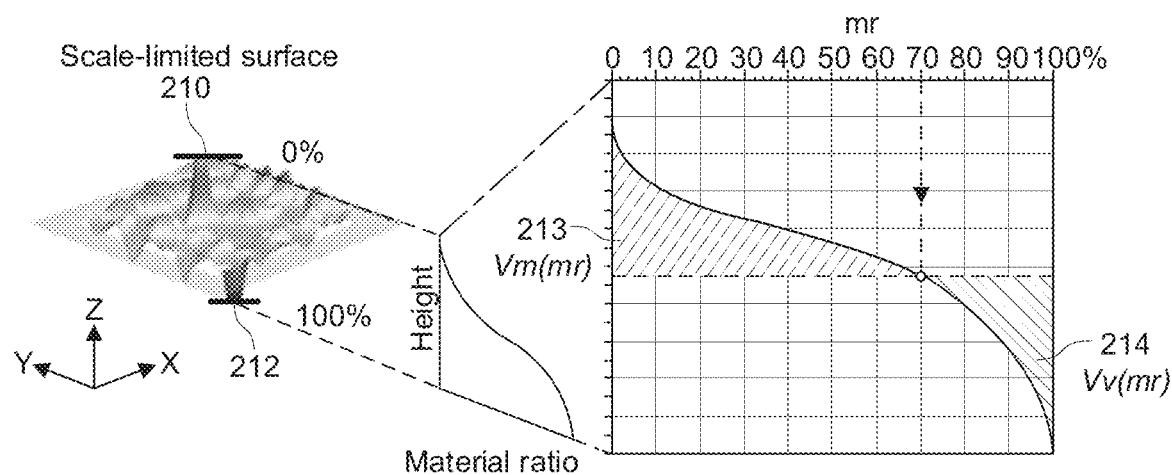
FIG. 2 shows a 3D surface plot and an areal material ratio plot.

The volume parameters as defined herein are illustrated with reference to FIG. 2, which shows a 3D surface and the derivation of the areal material plot for obtaining volume parameters. FIG. 2, left side, is a three-dimensional graphic representation of the surface geometry of a surface, such as surface-treated side of a surface-treated copper foil. FIG. 2, right side shows the derivation of an areal material ratio curve as can be obtained by using the ISO Standard Method ISO 25178-2:2012, which spans a material ratio (mr) of 0%, at the top of the highest peak 210, to the lowest valley 212 at which the mr is 100%.

The material volume (Vm) can be described as the volume of peaks existing on the surface and is quantified by integrating the volume of the material enclosed below the surface and above a horizontal cutting plane set at a height corresponding to a material ratio (mr) between 0% (the top of the peak 210) and 100% (the bottom of the valley 212). The material volume (Vm) is maximum where the material ratio is 100%, and the material volume (Vm) is a zero where the material ratio is 0%. For example, the Vm at 70% mr is shown as the shaded area 213 on the right side plot of FIG. 2.

The void volume (Vv) is calculated by integrating the volume of the voids enclosed above the surface and below a horizontal cutting plane set at a height corresponding to a specified material ratio (mr) between 0% (the top of the peak 210) and 100% (the bottom of the valley 212). The void volume (Vv) is zero where the material ratio is 100%, and the void volume (Vv) is a maximum where the material ratio is 0%. For example, the Vv at 70% mr is shown as the shaded area 214 on the right side plot of FIG. 2.

Figure 3A:
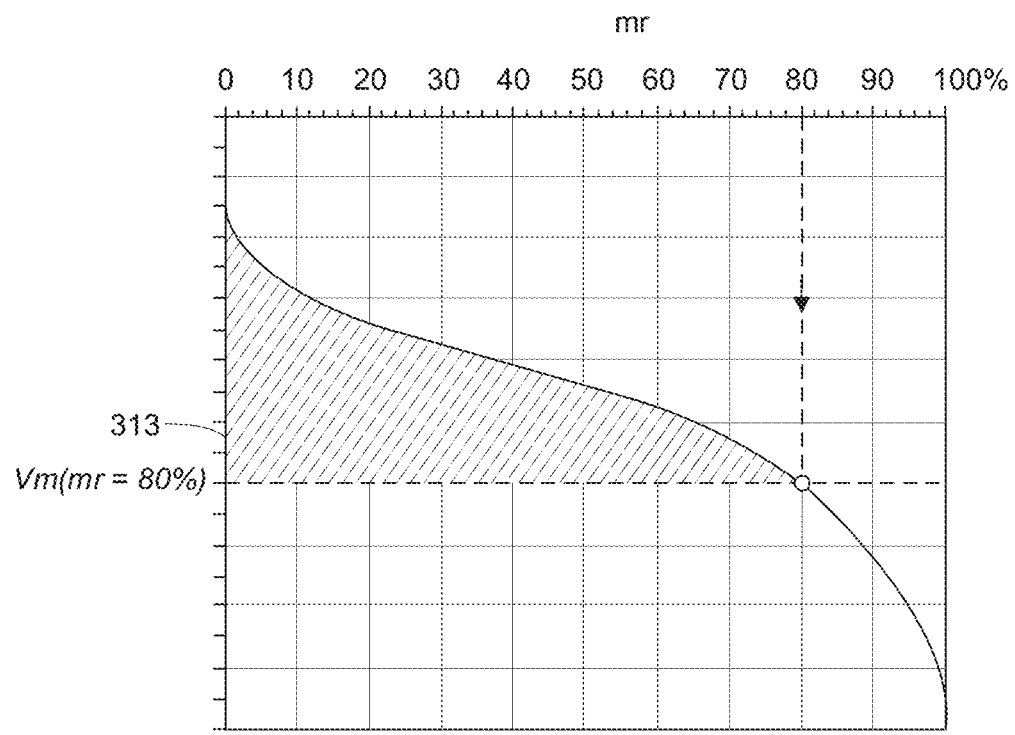
FIG. 3A illustrates the material volume (Vm) and FIG. 3B illustrates the void volume (Vv).
Figure 3B:
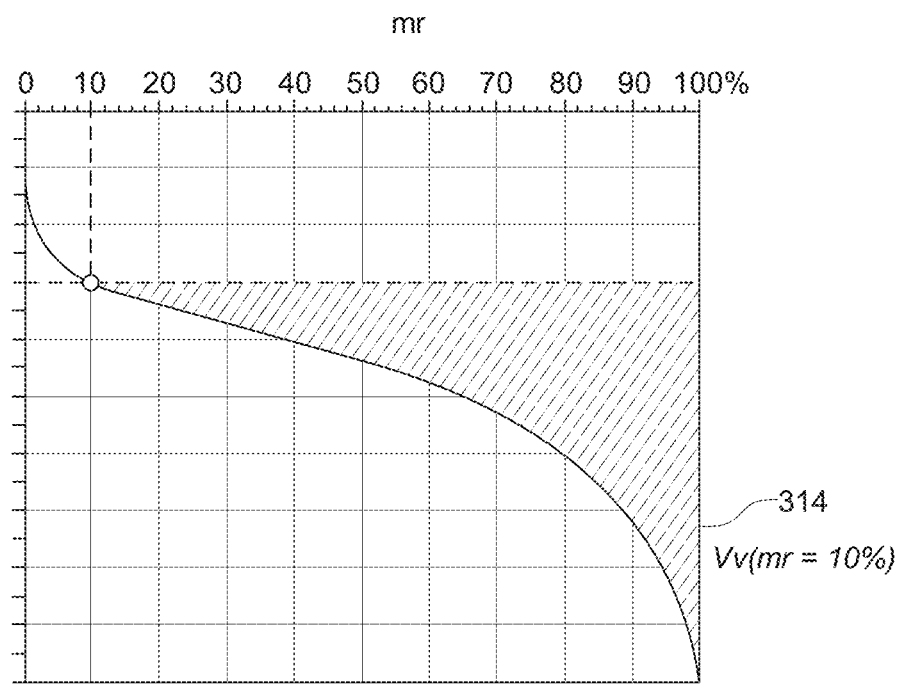

FIG. 3A shows the material volume (Vm) and FIG. 3B shows the void volume (Vv). As used herein the values listed for the material volume (Vm), unless otherwise specified, are the values when mr=80%. The Vm at mr=80% is shown in FIG. 3A as shaded area 313. As used herein the values listed for the void volume (Vv), unless otherwise specified, are the values when mr=10%. The Vv at mr=10% is shown in FIG. 3B shaded area 314.

In addition to the volume parameters, how a surface, such as the surface-treated side, interacts with light can characterize the surface. For example, the adsorption and reflection of specific wavelengths can provide a characterization of the surface topography and composition. One such parameter is the Yellowness Index (YI). The YI is an indicator of which wavelengths of light are reflected by the surface, or indirectly of which wavelengths are absorbed by the surface.

As used herein "yield strength" is a material property defined as the stress at which a material begins to deform plastically. Generally, this is determined by measuring the strain under an imparted stress and analyzing the data, for example by way of a stress-strain plot. Since curves in stress-strain plots can vary widely in shape according to the properties of the material tested, different methods of measuring and identifying the yield strength form stress-strain plots can be used depending on the material.

Figure 4:
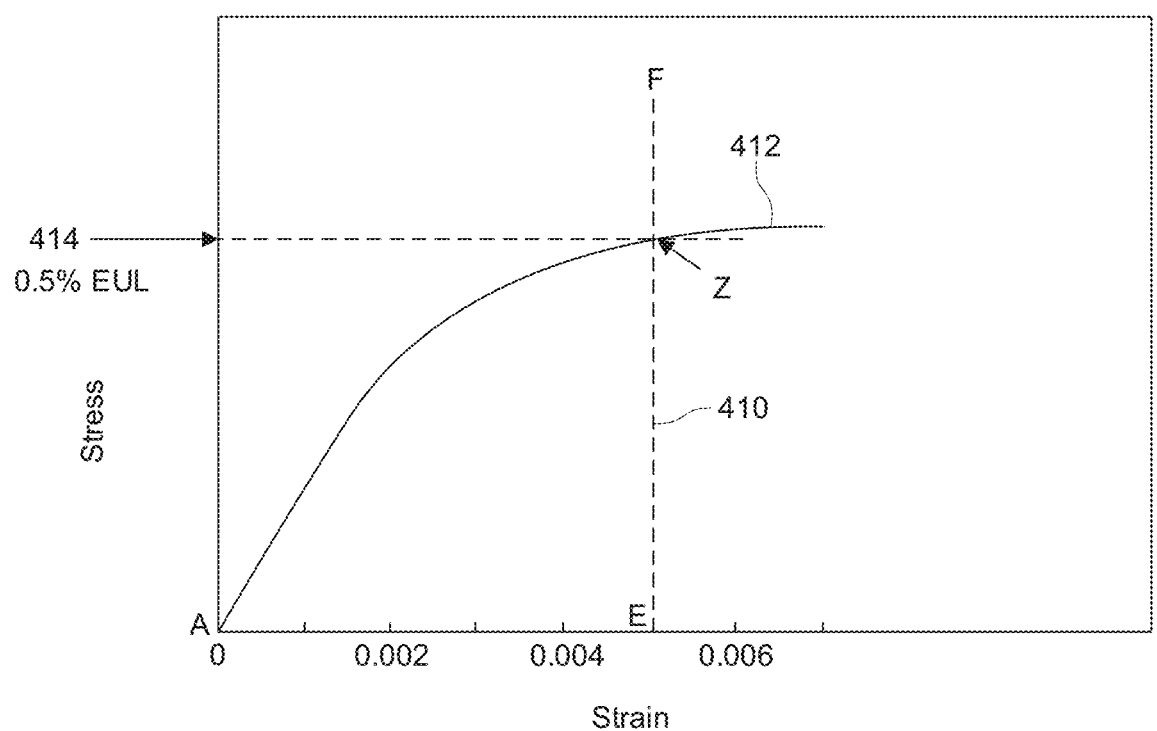
FIG. 4 shows a stress-strain plot illustrating the Extension Under Load method for quantifying yield strength.

For some materials, for example a low strength metal (such as thin copper foil), the material has a non-linear stress-strain relationship making it difficult to accurately measure the plastic strain. Thus, for low strength materials, such as an electrodeposited copper foil, the approach as shown with reference to the stress strain plot illustrated by FIG. 4, can be used. This method requires drawing an ordinate line 410 (line E-F), which intersects the curve 412 from a point on the x-axis where the elongation equals the specified extension. The stress value at the intersection of line E-F, point Z, is defined as the "Yield Strength at 0.5% Extension Under Load" or "0.5% EUL" denoted as 414 in the plot. In some embodiments, the yield strength is the Yield Strength at 0.5% EUL.

In some embodiments, the surface-treated copper foil 100 has a Vm on the surface-treated side 110, in a controlled range between a low and a high value, such as between a low value of about 0.05 $\mu m^3/\mu m^2$ and a high value of about 0.6 $\mu m^3/\mu m^2$. It is to be expressly understood that the ranges are continuous and can be represented by any value in this range. In some embodiments Vm has a low value of at least 0.05, 0.10, 0.11, 0.13, 0.18, 0.20, 0.25, 0.30. 0.31, 0.32, 0.33, 0.34, 0.40, 0.45, 0.50, 0.55. In some embodiments Vm has a high value of not more than 0.6, 0.55, 0.50, 0.46, 0.35, 0.34, 0.33, 0.32, 0.3, 0.25, 0.20, 0.19, 0.14, 0.12, 0.11, 0.057, or 0.05.

Without endorsing any particular mechanism or theory, higher Vm can provide better adhesion, for example to a resin. Controlling the Vm of the surface-treated side 110 within a proper range can reduce transmission loss while maintain good peel strength of the surface-treated copper foil with a resin.

In some embodiments, the surface-treated copper foil 100 has a Vv on the surface-treated side 110, in a controlled range between a low and a high value, such as between a low value of about 0.1 ($\mu m^3/\mu m^2$) and a high value of about 0.85 ($\mu m^3/\mu m^2$). It is to be expressly understood that these ranges are continuous and can be represented by any value in this range. In some embodiments Vv has a low value of at least 0.10, 0.11, 0.16, 0.17, 0.20, 0.22, 0.25, 0.30, 0.31, 0.35, 0.39, 0.40, 0.41, 0.43, 0.44. 0.50, 0.55, 0.60. 0.65, 0.70, 0.75 or 0.80. In some embodiments Vv has a high value of not more than 0.85, 0.80, 0.75, 0.70, 0.65, 0.60, 0.55, 0.50, 0.44, 0.43, 0.41, 0.40, 0.39, 0.35, 0.31, 0.30, 0.25, 0.22, 0.20, 0.17, 0.16, 0.11 or 0.10.

Without wishing to be bound by any particular theory, it is proposed that Vv can be viewed as the volume that can hold a resin substrate. Higher Vv can therefore result in a higher adhesion and peel strength with a resin. Conversely, if the Vv is too high, transmission loss at high frequencies can be increased due to signal disruption.

In some embodiments, the surface-treated copper foil 100 has a yield strength, such as based on extension under load method at 0.5%, in a controlled range between a low and a high value, such as between a low value of about 8.5 $kg/mm^2$ and a high value of about 26 $kg/mm^2$. It is to be expressly understood that these ranges of values between the low and high value of yield strength are continuous and can be represented by any value in this range. In some embodiments the yield strength has a low value of at least 8.50, 8.7, 8.9, 9.0, 10, 11, 12, 13, 14, 14.3, 15, 16, 16.6, 17, 17.7, 18, 18.1, 19.0, 20, 21, 22, 22.5, 23.0, 24, or 25. In some embodiments the yield strength has a high value of not more than 26, 25, 24, 23.0, 22.5, 22, 21, 20, 19.0, 18.1, 18, 17.7, 16.6, 16, 15, 14.3, 14, 13, 12, 11, 10, 9.0, 8.9, 8.7 or 8.50.

Without being bound by any particular theory it is proposed that if the yield strength of an electrodeposited copper foil is too high, such as more than about 26 $kg/mm^2$, the electrodeposited copper foil has too much internal stress so that curling or warping can occur. Conversely, where the yield strength of the electrodeposited copper foil is too low, such as less than about 8.5 $kg/mm^2$, the electrodeposited copper foil can tend to buckle and wrinkle too easily.

In some embodiments, the surface-treated copper foil 100 has a YI on the surface-treated side 110, in a controlled range between a low and a high value, such as between a low value of about 17 and a high value of about 52. It is to be expressly understood that the range of values is continuous and any value YI between and including this high and low value can be selected. In some embodiments the YI has a low value of at least 17, 18, 19, 20, 21, 25, 30, 35, 40, 45, 48, 49, 50, or 51. In some embodiments the YI has a high value of at least 52, 51, 50, 49, 48, 45, 40, 35, 30, 25, 21, 20, 19 or 18.

Without ascribing to a particular mechanism, YI is a property that is influenced by the topography and composition of the surface-treated side 110. It is found that in some embodiments control of these properties as exhibited by the YI, in the ranges described herein, provides high peel strength and low transmission loss.

In some embodiments the nodule layer, such as nodule layer 112, can include metal nodules such as copper nodules. The nodules can be formed, for example, by electroplating the metal onto the electrodeposited copper foil. In some embodiments, the copper nodules can be made of copper or copper alloy. In some embodiments, the surface roughness of surface-treated side 110, such as Vm, and Vv, is dominated by the nodule layer 112, since barrier layer 114, anti-tarnish layer 116, and coupling layer 118 in any combination can be much thinner than the nodule layer 112.

As used herein the "barrier layer" is a layer made of metal or an alloy containing the metal. In some embodiments the barrier layer, such as barrier layer 114, is made of at least one metal selected from zinc (Zn), chromium (Cr), nickel (Ni), cobalt (Co), molybdenum (Mo), vanadium (V), iron (Fe), tin (Sn), and combinations thereof In some embodiments the barrier layer comprises Ni. In some embodiments the barrier layer comprises Zn. In some embodiments the barrier layer comprises a Ni layer and a Zn layer.

As used herein an "anti-tarnish layer," such as anti-tarnish layer 116, is a coating applied to a metal that can protect the coated metal from degradation such as due to corrosion. In some embodiments, the anti-tarnish layer comprises a metal or an organic compound. For example, chromium or chromium alloys can be used as a metal coating on the electrodeposited copper foil. When the anti-tarnish layer is made of chromium alloy, it further contains any one or more of zinc (Zn), nickel (Ni), cobalt (Co), molybdenum (Mo), and vanadium (V). In some embodiments where the anti-tarnish layer is made of organics, the layer may comprise at least one member selected from the group consisting of triazoles, thiazoles, and imidazoles, or their derivatives. The triazole group includes but is not limited to orthotriazole (1,2,3-triazole), benzotriazole, tolyltriazole, carboxybenzotriazole, chlorine substituted benzotriazole, 3-amino-1,2,4-triazole, 2-amino-1,3,4-triazole, 4-amino-1,2,4-triazole, 1-amino-1,3,4-triazole, and isomers thereof, or derivatives thereof. The thiazole group includes but not limites to thiazole, 2-mercaptobenzothiazole, dibenzothiazyldisulfide, and isomers thereof, or derivatives thereof. The imidazole group includes but not limites to imidazole, 2-methylimidazole, 2-ethyl-4-methylimidazole, 2-phenylimidazole, 1-benzyl-2-methyl-imidazole, and isomers thereof, or derivatives thereof.

As used herein the "coupling layer," such as coupling layer 118, is a layer that is added to improve the binding between the copper foil and a resin layer, for example a resin layer used in the manufacture of circuit boards. In some embodiments this is provided by a silane treatment which provides a layer including silicon and oxygen. The silane can be exemplified but not limited to amino-based silane, epoxy-based silane, and mercapto-based silane. The silane may be selected from vinyltrimethoxysilane, vinyltri ethoxysilane, 2-(3,4-epoxycyclohexyl)ethyltrimethoxysilane, 3-glycidoxypropyl methyldimethoxysilane, 3-glycidoxypropyl trimethoxysilane, 3-glycidoxypropyl methyldiethoxysilane, 3-glycidoxypropyl triethoxysilane, p-styryltrimethoxysilane, 3-methacryloxypropyl methyldimethoxysilane, 3-methacryloxypropyl trimethoxysilane, 3-methacryloxypropyl methyl diethoxysilane, 3-methacryloxypropyl triethoxysilane, 3-acryloxypropyl trimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, partially hydrolyzates of 3-triethoxysilyl-N-(1,3-dimethyl-butylidene)propylamine, N-(vinylbenzyl)-2-aminoethyl-3-aminopropyltrimethoxysilane hydrochloride, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltrialkoxysilane, 3-mercaptopropylmethyldimethoxysilane, 3-mercaptopropyltrimethoxysilane, and 3-isocyanatepropyltriethoxysilane, but not limited thereof.

In some embodiments the sub-layers, such as the sub-layers of treatment layer 108, are provided so that the nodule layer 112 is covered with the barrier layer 114, the barrier layer 114 is covered with the anti-tarnish layer 116 and the anti-tarnish layer 116 is covered with the coupling layer 118; however, according to other embodiments, the stacking order or number of the sub-layers is not limited therein. In the embodiment shown by FIG. 1, the final physical surface of the surface treated side 110 is therefore provided by the coupling layer 118 which can then be coupled to a resin layer in a laminate structure. In some embodiments, the surface roughness of surface-treated side 110, such as Vm and Vv is dominated by the nodule layer 112, since barrier layer 114, anti-tarnish layer 116, and coupling layer 118 in any combination can be much thinner than the nodule layer 112.

In some embodiments, the surface-treated copper foil such as 100 and a resin layer are combined to form a laminated structure. The structure can include two or more layers of alternating copper foil and resin layer. These can be formed, for example, by stacking alternate sheets of the copper foil, at least one being a surface-treated copper foils 100, and a resin layer, and compressing the stack together using a press while heating the stack. In some embodiments, the resin layer is contacted with the surface-treated side 110 of the surface treated copper foil 100. Where more than three conductive layers, e.g., at least one being a surface-treated copper foil 100, are alternated with resin layers, the laminate is a multilayer structure such as can be used to make a multilayer PCB (printed circuit board).

As used herein a "resin" relates to an organic polymeric material that can be formed as a sheet or layer on a substrate such as a surface-treated copper foil. Some examples of a resin include phenolic resins, epoxy resins, polyester resins (e.g., polyethylene terephthalates), polyimide resins, acrylics, formaldehyde resins, bismaleimide triazine resins, cyanate ester resin, fluoropolymers, poly ether sulphone, cellulosic thermoplastics, polycarbonate, polyolefins, polypropylene, polysulfide and polyurethane. The resins can also include filler materials or reinforcing materials such as aramide, carbon, glass, cellulosic and inorganic materials, all of these optionally in the form of particles, fibers, chopped fibers, woven materials or a webbing. In some embodiments the resin is formed into a sheet using one or more of the resins and one or more of the filler materials in a composite sheet. In some embodiments one or more resin layers are stacked on top of each other and in direct contact to provide a multi-stack resin layer sometimes referred to a multiple board. As used herein a resin layer can refer to a multi-stack resin layer such as a multiple board.

In some embodiments the surface-treated copper foil 100 is used to produce a circuit board (e.g., a printed circuit board or PCB). For example, a circuit board formed using a laminate of the copper foil and a resin layer. Further processing such as the production of conducting lines or tracks, contact pads, shielding areas, and conduction vias can be achieved by known processing methods such as lithography, copper etching, and drilling of the copper foil/resin laminate. Components, such as batteries, resistors, LEDs, relays, transistors, capacitors, inductors, diodes, switches, microcontrollers, crystals and oscillators, and integrated circuit can be mounted (e.g., mechanically and electrically connected) to the circuit board by known methods. For example, surface mount methods or the through-hole methods to attach the components, and pick and place technologies for assembly.

In some embodiments the surface-treated copper foil 100 can be used for making a circuit board, including a plurality of components mounted on the circuit board, that is used in a device. As used herein a device comprises any item or component for processing an electric signal such as by manipulation of the voltage, current, frequency or power of the signal. For example, and without limitation, a computer such as used in a laptop, desktop, vehicles, phones, measurement and monitoring devices (e.g., glucose meter, pH meter, air monitoring device), data output devices (e.g., monitors, printers), input devices (touch screens, keyboards, mouse), and wireless transmission/receiving devices such as Wi-Fi, Zigbee and Bluetooth.

It should be understood within the scope of the present disclosure, the above-mentioned technical features and technical features mentioned below (such as examples) can be combined freely and mutually to form new or preferred technical solutions, which are omitted for brevity.

EXAMPLES

General Copper Foil Preparation

The system for manufacturing the electrodeposited copper foil includes a metal cathode drum and an insoluble metal anode. The metal cathode drum is rotatable and has a polished surface. In this system, the insoluble metal anode is arranged at approximately the lower half of the metal cathode drum and surrounds the metal cathode drum. The electrodeposited copper foil is manufactured using continuous electrodeposition by flowing the copper sulfate electrolyte solution between the metal cathode drum and the insoluble metal anode, applying an electrical current between these to allow copper ions to be drawn to the metal cathode drum and reduced causing electrodeposited copper on the metal cathode drum forming the electrodeposited copper foil, and detaching the electrodeposited copper foil from the metal cathode drum when a predetermined thickness is obtained.

Electrodeposited Copper Foil Preparation.

Copper wire was dissolved in an aqueous solution of sulfuric acid (50 wt %) to prepare a copper sulfate electrolyte solution which contained 320 g/L of copper sulfate ($CuSO_4.5H_2O$) and 95 g/L of sulfuric acid. Hydrochloric acid (obtained from RCI Labscan Ltd) was added to provide a chloride ion concentration of 30 mg/L in the copper sulfate electrolyte solution. 6.5 mg/L of PEI (polyethylenimine, linear, Mn=5000, available from Sigma-Aldrich Company) and 4 mg/L of saccharin (1,1-dioxo-1,2-benzothiazol-3-one, available from Sigma-Aldrich Company) were also added.

After preparation of the copper containing electrolyte, electrodeposited copper foil was prepared by electrodeposition. During the electrodeposition, the liquid temperature of the copper sulfate electrolyte solution was maintained at about 52° C., and the current density was maintained at about 48 A/dm². Electrodeposited copper foils having a thickness of about 18 µm were prepared.

Surface Treatment.

In a first step for the roughening treatment, after preparing the electrodeposited copper foil as outlined above, the electrodeposited copper foil is cleaned by using an acid solution. An acid washing vessel was used for this procedure where the vessel was filled with an electrolyte containing 130 g/L copper sulfate and 50 g/L sulfuric acid and a temperature of about 27° C. was maintained for the solution. The electrodeposited copper foil was directed into an acid washing vessel where it was soaked into the electrolyte for 30 seconds to remove the oil, fat and oxide on the surface. The electrodeposited copper foil was then rinsed with water.

The nodule layer was then formed by electroplating on the surface of the deposited side of the electrodeposited copper foil. For plating the nodule layer, a copper sulfate solution was used as the plating electrolyte which contained 70 g/L of copper sulfate and 100 g/L of sulfuric acid. The temperature of the copper sulfate solution was maintained at about 25° C., and the electrodeposited copper foil was electroplated for 10 seconds at a current density selected between 34 and 49 A/dm² as listed in the Table. This roughening treatment provides a nodule layer on the deposited side or.

To prevent exfoliation of the nodule layer, a copper covering was deposited onto the nodules by electrodeposition. In this covering process, a copper sulfate solution was used in which the concentrations of copper sulfate and sulfuric acid were 320 g/L and 100 g/L, respectively. The temperature of electrolyte solution was maintained at about 40° C. The current density during this electrodeposition step is selected in a range of 5 to 18 A/dm² for 10 seconds, as listed in the Table.

After completing the cover plating process, two barrier layers were applied. First, nickel was deposited on the surface of nodular layer. The electrolysis conditions were as follows nickel sulfate 188 g/L, boric acid 32 g/L, hypophosphorous acid 5 g/L, and temperature 20° C., pH 3.5. The current density was set at 0.5 A/dm² for 3 seconds. Secondly, after a water wash a zinc layer was deposited on the nickel layer and the drum side of the electrodeposited copper foil simultaneously. The zinc is provided by a zinc sulfate of 11 g/L solution, maintained at pH 13 and a temperature of 15° C. during electrodeposition. The current density was set is a range of 0.4 to 2.5 A/dm² for 3 seconds as listed in the Table.

After formation of the barrier layers, washing is conducted with water and a chromium anti-tarnish layer was formed on the zinc layer by electroplating in a plating bath. The plating bath containing 5 g/L of chromic acid was maintained at pH 12.5 and a temperature of 17° C. The plating is conducted with a current density of 1.0 A/dm² for 3 seconds to form the chromium layer.

Finally, a coupling layer was formed on the chromium layer at the deposited side. A silane solution is sprayed on the chromium layer for 3 seconds. The silane solution was a water solution containing 0.25 wt % of 3-Aminopropyltriethoxysilane.

After silane treatment the foil is heated at 120° C. for a one-minute residence time in an oven and then wound into a roll.

Copper Foil Characterization

Copper foils made as described above and with specific conditions are indicated in the Table. Twelve experiments and eight comparative examples are listed. Data listed exemplifies some embodiments of the surface treated copper foil. Good characteristics for the surface-treated copper foil are considered to be: a peel strength above about 0.40 N/mm; peel strength decay rate after heating below about 35.0%; good transmission loss performance with values greater than about −24.0 dB/m. It can be seen that certain ranges of Vm and YI provide these good characteristics in experiments 1-12, while others do not provide all these characteristics as shown in comparative experiments 1-8. Some specific examples and comparative examples are discussed to aid in understanding the embodiments. In addition, copper foil exhibiting a certain range of Vv can have proper peel strength. In addition, other characteristics, such as curl of less than about 10 mm and no wrinkle formation, for the surface-treated copper foil can be further improved through controlling yield strength in a certain range.

Example 3 shows an acceptable Vm of 0.051 µm³/µm² and a YI of 17, so that the test sample has good transmission loss performance of −10 dB/m, good peel strength of 0.40, and good peel strength decay rate of 27.5%. Similarly, Example 10 shows an acceptable Vm of 0.057 µm³/µm² and a YI of 19, so that the test sample has good transmission loss performance of −10.5 dB/m, good peel strength of 0.40, and good peel strength decay rate of 22.5%. Similarly, however, comparative example 2 shows a lower Vm of 0.035 µm³/µm², so that the peel strength becomes unacceptably low at 0.32 N/mm and a transmission test was not performed. In addition, example 3 and example 10 show yield strength of 19 kgf/mm² and 23.0 kg/mm², and they have no wrinkle formation and low curl of 3 mm and 7 mm; however, in contrast, comparative example 2 shows very high yield strength of 34.5 kg/mm² and the curl becomes unacceptably high at 15 mm due to the high yield strength.

Example 5 shows a high Vm of 0.598 µm³/µm² and a YI of 20. The peel strength for example 5 is high at 0.53 N/mm while the transmission loss is still acceptable at −23 dB/m. However, comparative example 1 has an even higher Vm of 0.747 µm³/µm². The peel strength for comparative example 1 is very high at 0.61 N/mm but the transmission loss is unacceptably at −32.5 dB/m. In addition, it can be seen that example 5 shows no wrinkle and low curl at 1 mm possibly due to having proper yield strength at 9.0 kg/mm², but comparative example 1 exhibited wrinkling possibly due to the low yield strength of 6.9 kg/mm².

Example 6 and comparative example 4 have very similar volume parameters. Accordingly, the peel strength is good. However, whereas the transmission loss in example 6 is good at −16.9 dB/m, the transmission loss in comparative example 4 is unacceptable at −25.6 dB/m. The reason for this is a poor surface property that is characterized by the high YI. Where the YI of example 6 is high at 52, the transmission loss it is still acceptable, while the YI of comparative example 4 is too high at 61 and the transmission loss is not acceptable. In addition, example 6 and comparative example 4 have acceptable yield strengths; accordingly, curl and wrinkle characteristics are good.

Comparative example 6, where the YI is 10, shows that when the YI is too low, the peel strength is too low (0.35 N/mm) and the peel strength decay rate after heating is too high (45.7%).

Other data to note are of comparative example 3, exhibiting Vm at 0.735 $\mu m^3/\mu m^2$ and YI at 17, and comparative example 7, exhibiting Vm at 0.650 $\mu m^3/\mu m^2$ and YI at 17. These volume parameters are high and the characteristics of the copper foils are accordingly poor with an unacceptable transmission loss of −29.4 dB/m for comparative example 3 and −29.3 dB/m for comparative example 7. These also exhibit very high peel strength decay rate after heating, 39.3% for comparative example 7 and 46.6% for comparative example 3.

Comparative example 5 exhibits the lowest volume parameters in the Table, with Vm at 0. 0.024 $\mu m^3/\mu m^2$. The peel strength is also the lowest in the table at 0.31 N/mm and the peel strength decay rate after heating is high at 35.5%. Comparative example 8 also has low Vm at 0.095 $\mu m^3/\mu m^2$ but it is close to acceptable value. However, the YI is high at 60. Where the peel strength at 0.42 N/mm and peel strength decay rate after heating at 11.9% are acceptable, the transmission loss is unacceptable at −24.9 dB/m.

scope. The laser microscope was a LEXT OLS5000-SAF manufactured by Olympus and the images were made at an air temperature of 24±3° C. and a relative humidity of 63±3%.

Settings used for the measurements were as follows: Light source was 405 nm-wavelength; Objective lenses used were 100× (MPLAPON-100×LEXT); Optical zoom was 1.0×; Area was 129 μm×129 μm; Resolution was 1024 pixels× 1024 pixels; Conditions were Auto tilt removal; and the Filter was set as unfiltered.

The parameters "Vm" is calculated with the material ratios from 0% to 80%. The parameter "Vv" is calculated with the material ratios from 10% to 100%. The units of material volume and void volume are $\mu m^3/\mu m^2$.

Yellowness Index (YI)

The yellowness index was measured using a spectrophotometer CM-2500c, manufactured by Konica Minolta. The illuminant used was D65. The Standard Observer Function was 2°. The standard used was CIE 1931.

Yield Strength (0.5% EUL)

The yield strength values were obtained via the method of IPC-TM-650 2.4.18. The surface-treated electrodeposited copper foil for each example and comparative example was cut to obtain a test sample with a size of 100 mm×12.7 mm (length×width), and the test sample was measured at room temperature (about 25° C.) under the conditions of a chuck distance of 50 mm and a crosshead speed of 50 mm/min using Model AG-I testing machine manufactured by Shimadzu Corporation. Recording of measurements commenced after the applied force exceeded 0.075 kg. The yield strength (0.5% EUL) was obtained by drawing a straight line parallel to the Y axis (stress) at a point where the strain is 0.5% ($\epsilon$=0.005) in a curve of the relationship between strain and stress similar to as previously described.

Peel Strength Test

TABLE

Conditions and Copper Foil Properties

| Experiment | PEI ppm | saccharin ppm | Roughening current density A/dm² | Covering current density A/dm² | Zn plating current density A/dm² | Vm μm³/μm² | Vv | YI | Yield strength kgf/mm² | Peel strength N/mm | Peel strength decay rate after heating % | Trans. loss dB/m | Curl mm | Wrinkle |
|---|---|---|---|---|---|---|---|---|---|---|---|---|---|---|
| Ex. 1 | 6.5 | 4 | 34 | 9 | 0.4 | 0.324 | 0.39 | 17 | 8.5 | 0.46 | 23.9 | −14.6 | 0 | No |
| Ex. 2 | 12.5 | 4 | 34 | 9 | 0.4 | 0.113 | 0.17 | 18 | 14.3 | 0.44 | 27.3 | −12 | 2 | No |
| Ex. 3 | 12.5 | 6 | 34 | 9 | 0.4 | 0.051 | 0.10 | 19 | 19 | 0.4 | 27.5 | −10 | 3 | No |
| Ex. 4 | 6.5 | 6 | 34 | 9 | 0.4 | 0.183 | 0.22 | 18 | 16.6 | 0.43 | 25.6 | −11 | 2 | No |
| Ex. 5 | 6.5 | 4 | 49 | 9 | 0.4 | 0.598 | 0.85 | 20 | 9 | 0.53 | 28.3 | −23 | 1 | No |
| Ex. 6 | 6.5 | 4 | 34 | 14 | 0.4 | 0.337 | 0.43 | 52 | 8.7 | 0.48 | 27.1 | −16.9 | 0 | No |
| Ex. 7 | 12.5 | 6 | 49 | 9 | 0.4 | 0.456 | 0.73 | 21 | 17.7 | 0.5 | 34 | −19.8 | 3 | No |
| Ex. 8 | 6.5 | 6 | 34 | 14 | 0.4 | 0.342 | 0.44 | 49 | 18.1 | 0.49 | 30.6 | −15.9 | 3 | No |
| Ex. 9 | 6.5 | 4 | 34 | 9 | 2 | 0.319 | 0.41 | 51 | 8.9 | 0.47 | 14.9 | −20.7 | 1 | No |
| Ex. 10 | 18.5 | 4 | 34 | 9 | 0.4 | 0.057 | 0.11 | 19 | 23 | 0.4 | 22.5 | −10.5 | 7 | No |
| Ex. 11 | 6.5 | 8 | 34 | 9 | 0.4 | 0.108 | 0.16 | 20 | 25.7 | 0.42 | 33.3 | −12.8 | 9 | No |
| Ex. 12 | 12.5 | 6 | 42 | 12 | 1 | 0.134 | 0.31 | 48 | 22.5 | 0.41 | 19.7 | −15.3 | 7 | No |
| Comp. 1 | 0.5 | 2 | 34 | 9 | 0.4 | 0.747 | 0.96 | 18 | 6.9 | 0.61 | 26.4 | −32.5 | 0 | Yes |
| Comp. 2 | 24.5 | 10 | 34 | 9 | 0.4 | 0.035 | 0.07 | 20 | 34.5 | 0.32 | 38.1 | NA | 15 | No |
| Comp. 3 | 6.5 | 4 | 54 | 9 | 0.4 | 0.735 | 0.90 | 17 | 9.1 | 0.58 | 46.6 | −29.4 | 3 | No |
| Comp. 4 | 6.5 | 4 | 34 | 18 | 0.4 | 0.352 | 0.47 | 61 | 9.3 | 0.53 | 24.5 | −25.6 | 1 | No |
| Comp. 5 | 6.5 | 4 | 29 | 9 | 0.4 | 0.024 | 0.05 | 18 | 8.8 | 0.31 | 35.5 | NA | 0 | No |
| Comp. 6 | 6.5 | 4 | 34 | 5 | 0.4 | 0.329 | 0.42 | 10 | 9.6 | 0.35 | 45.7 | NA | 0 | No |
| Comp. 7 | 12.5 | 6 | 54 | 9 | 0.4 | 0.650 | 0.88 | 17 | 17.4 | 0.56 | 39.3 | −29.3 | 3 | No |
| Comp. 8 | 12.5 | 6 | 34 | 9 | 2.5 | 0.095 | 0.13 | 60 | 18.4 | 0.42 | 11.9 | −24.9 | 3 | No |

Test Methods

Volume Parameters

Material volume (Vm) and Void volume (Vv) of the copper foil were measured in accordance with ISO 25178-2:2012 by using surface texture analysis of laser micro- A surface treated copper foil was placed on a resin substrate (Megtron6 from Panasonic corporation), and the treatment layer having the nodule layer was contacted with the resin substrate. Subsequently both the copper foil and resin were placed into a vacuum press machine. The lamination condition used were: a pressing pressure 30 kg/cm$^2$; a temperature of 190° C.; and a press time of 120 minutes. IPC-TM-650 test method was used to evaluate the peel strength.

Peel Strength Decay Rate After Heating

A surface-treated copper foil and resin were combined to form a laminate as previously described in the Peel Strength test. The lamination sample was subsequently place in a 180° C. oven for 48 hr. IPC-TM-650 test method was used to evaluate peel strength after the lamination sample was cooled down.

$$\text{Peel Strength Decay Rate} = \left|\frac{\text{Peel strength after heating} - \text{Peel strength before heating}}{\text{Peel strength before heating}}\right| \times 100\%$$

Transmission Loss

The transmission characteristics were evaluated using a strip-line resonator technique. A copper foil was attached on a resin and further made into a strip-line, and this strip-line was used as source electrode. The thickness of the resin (S7439G from SyTech Corporation) was 152.4 µm, and had Dk=3.74 and Df=0.006 under 10 GHz signal test by IPC-TM 650 No. 2.5.5.5. The strip-line had a length=100 mm, width=120 µm, and thickness=18 µm.

After the strip-line was made, two surfaces were covered with two other resins (S7439G from SyTech Corporation), respectively, and two other copper foils were disposed on the resins as ground electrode. This assembly was without coverlay film and has a characteristic impedance of about 50Ω. Comparison of the signals transferred by the strip-line and the ground electrode provides the transmission Loss.

The measurement of the strip line and ground electrode was done using an Agilent PNA N5230C network analyzer. The frequency range used was 200 MHz to 15 GHz, the sweep number was 6401 point, the calibration was TRL and the test method was the Cisco S method.

Wrinkle Test

A surface-treated copper foil with 1000 mm width was subjected to a tension of about 30 to 35 kgf. Visual inspection with a visual inspection machine determines whether wrinkling occurs.

Curl Test

The test is conducted by placing a 100 mm×100 mm surface-treated copper foil on a table. The height of the four corners is measure using a ruler, and the highest value is the measure of curl.

As used herein the term "comprising" or "comprises" is used in reference to compositions, methods, and respective component(s) thereof, that are essential to the claimed invention, yet open to the inclusion of unspecified elements, whether essential or not.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about". The term "about" when may mean ±5% (e.g., ±4%, ±3%, ±2%, ±1%) of the value being referred to.

Where a range of values is provided, each numerical value between and including the upper and lower limits of the range is contemplated as disclosed herein. It should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. A surface-treated copper foil comprising:
   an electrodeposited copper foil including a drum side and a deposited side, and
   a treatment layer disposed on the deposited side providing a surface-treated side,
   wherein the treatment layer comprises a nodule layer and wherein the surface-treated side exhibits a material volume (Vm) in a range of 0.05 to 0.6 µm$^3$/µm$^2$ and a yellowness index (YI) in a range of 17 to 52.

2. The surface-treated copper foil of claim 1, wherein the surface-treated side exhibits a material volume (Vm) in a range of 0.05 to 0.5 µm$^3$/µm$^2$.

3. The surface-treated copper foil of claim 2, wherein the surface-treated side exhibits a material volume (Vm) in a range of 0.05 to 0.3 µm$^3$/µm$^2$.

4. The surface-treated copper foil of claim 1, wherein the surface-treated side exhibits a void volume (Vv) in a range of 0.10 to 0.85 µm$^3$/µm$^2$.

5. The surface-treated copper foil of claim 4, wherein the surface-treated side exhibits a void volume (Vv) in a range of 0.39 to 0.85 µm$^3$/µm$^2$.

6. The surface-treated copper foil of claim 4, wherein the surface-treated side exhibits a void volume (Vv) in a range of 0.50 to 0.85 $\mu m^3/\mu m^2$.

7. The surface-treated copper foil of claim 1, which exhibits a yield strength in a range of 8.5 kg/mm² to 26 kg/mm² based on extension under load method at 0.5% strain.

8. The surface-treated copper foil of claim 7, which exhibits a yield strength in a range of 8.5 kg/mm² to 20 kg/mm² based on extension under load method at 0.5% strain.

9. The surface-treated copper foil of claim 7, which exhibits a yield strength in a range of 8.5 kg/mm² to 17 kg/mm² based on extension under load method at 0.5% strain.

10. The surface-treated copper foil of claim 1, wherein the treatment layer further comprises at least one of a barrier layer, an anti-tarnish layer, and a coupling layer.

11. The surface-treated copper foil of claim 10, wherein the barrier layer is made of metal or alloy containing the metal, and the metal is selected from at least one of Ni, Zn, Cr, Co, Mo, Fe, Sn, and V.

12. The surface-treated copper foil of claim 10, wherein the coupling layer includes silicon.

13. The surface-treated copper foil of claim 1, wherein the nodule layer comprises copper nodules.

14. A laminate comprising,
a resin layer, and
a surface-treated copper foil comprising,
    an electrodeposited copper foil including a drum side and a deposited side,
    a treatment layer disposed on the deposited side providing a surface-treated side in contact with the resin layer, and wherein the treatment layer comprises a nodule layer,
    wherein the surface-treated side exhibits a material volume (Vm) in a range of 0.05 to 0.6 $\mu m^3/\mu m^2$, a yellowness index (YI) in a range of 17 to 52, a void volume (Vv) in a range of 0.10 to 0.85 $\mu m^3/\mu m^2$, and
    wherein the surface-treated copper foil exhibits a yield strength in a range of 8.5 kg/mm² to 26 kg/mm² based on extension under load method at 0.5% strain.

15. A device comprising,
a circuit board comprising the surface-treated copper foil of claim 1 and a plurality of components mounted on the circuit board,
wherein at least a first component and a second component of the plurality of components are electrically connected to each other through the surface-treated copper foil of the circuit board.

* * * * *